United States Patent
Vangal

(10) Patent No.: US 11,211,540 B1
(45) Date of Patent: Dec. 28, 2021

(54) THERMOELECTRIC GENERATOR SLEEVE

(71) Applicant: Pratik Sriram Vangal, Portland, OR (US)

(72) Inventor: Pratik Sriram Vangal, Portland, OR (US)

( * ) Notice: Subject to any disclaimer, the term of this patent is extended or adjusted under 35 U.S.C. 154(b) by 223 days.

(21) Appl. No.: 16/297,512

(22) Filed: Mar. 8, 2019

Related U.S. Application Data

(60) Provisional application No. 62/640,990, filed on Mar. 9, 2018.

(51) Int. Cl.
| | | |
|---|---|---|
| H01L 35/32 | (2006.01) |
| F21K 9/235 | (2016.01) |
| H01L 35/30 | (2006.01) |
| F21K 9/272 | (2016.01) |
| F21K 9/275 | (2016.01) |
| F21V 29/70 | (2015.01) |
| F21V 29/54 | (2015.01) |
| F21V 29/74 | (2015.01) |
| F21V 23/06 | (2006.01) |
| F21V 23/04 | (2006.01) |
| F21Y 115/10 | (2016.01) |
| F21Y 115/20 | (2016.01) |
| F21Y 101/00 | (2016.01) |

(52) U.S. Cl.
CPC .............. *H01L 35/32* (2013.01); *F21K 9/235* (2016.08); *F21K 9/272* (2016.08); *F21K 9/275* (2016.08); *F21V 23/0457* (2013.01); *F21V 23/06* (2013.01); *F21V 29/54* (2015.01); *F21V 29/70* (2015.01); *F21V 29/74* (2015.01); *H01L 35/30* (2013.01); *F21Y 2101/00* (2013.01); *F21Y 2115/10* (2016.08); *F21Y 2115/20* (2016.08)

(58) Field of Classification Search
CPC .......... F21K 9/235; F21K 9/272; F21K 9/275; F21V 23/0457; F21V 23/06; F21V 29/54; F21V 29/70; F21V 29/74; F21Y 2101/00; F21Y 2115/10; F21Y 2115/20; H01L 35/30; H01L 35/32
See application file for complete search history.

(56) References Cited

U.S. PATENT DOCUMENTS

| | | | |
|---|---|---|---|
| 5,473,517 A * | 12/1995 | Blackman | F21S 9/022 362/95 |
| 5,785,418 A | 7/1998 | Hochestein | |
| 7,103,292 B2 * | 9/2006 | Hirst | G03G 15/2039 399/122 |
| 9,373,769 B2 * | 6/2016 | Lee | H01L 35/30 |

(Continued)

*Primary Examiner* — Zheng Song
(74) *Attorney, Agent, or Firm* — Law Offices of J. Curtis Edmondson; J. Curtis Edmondson

(57) ABSTRACT

A thermoelectric generator sleeve is adapted to be attached to a base of an electrical socket, which has one or more light bulbs (Incandescent, Fluorescent, LED, etc.). The heat created by the light bulbs is absorbed by the thermoelectric generator sleeve that allows the efficient conversion of heat energy into electrical energy by using thermoelectric generators. The aesthetically designed spatial configuration of the thermoelectric generators provides efficient thermal energy conversion and storage for the converted heat energy. Additional electronic circuitry to regulate the energy produced is holistically integrated into the thermoelectric generator sleeve to provide added functionality and safety.

16 Claims, 13 Drawing Sheets

(56) References Cited

U.S. PATENT DOCUMENTS

| | | | |
|---|---|---|---|
| 2002/0070633 A1* | 6/2002 | Salender | H01L 35/00 310/306 |
| 2004/0120156 A1 | 6/2004 | Ryan | |
| 2005/0000559 A1* | 1/2005 | Horio | H01L 35/30 136/205 |
| 2013/0050995 A1* | 2/2013 | Hsu | H01L 35/30 362/181 |
| 2013/0114209 A1* | 5/2013 | Lai | H01L 23/36 361/700 |
| 2014/0164797 A1* | 6/2014 | Marx | H02J 7/32 713/300 |
| 2014/0313716 A1 | 10/2014 | Lang | |
| 2015/0182046 A1* | 7/2015 | Walsh | F21V 33/0004 206/459.5 |
| 2016/0118569 A1* | 4/2016 | Feng | F21V 29/58 362/157 |
| 2016/0128141 A1* | 5/2016 | Makosinski | H02J 7/00 315/294 |
| 2016/0290585 A1* | 10/2016 | Lee | F21S 41/151 |
| 2016/0348859 A1* | 12/2016 | Wang | F21K 9/64 |
| 2017/0321850 A1* | 11/2017 | Chien | F21V 14/02 |

\* cited by examiner

THERMOELECTRIC GENERATOR SLEEVE

CROSS REFERENCE TO RELATED APPLICATIONS

The present application claims the benefit of U.S. Provisional Patent Application No. 62/640,990, filed on Mar. 9, 2018 and entitled "Systems, Apparatus and Methods for Electricity Generation and Storage" which is herein incorporated by reference in its entirety.

FIELD

The inventive subject matter relates to a lamp insert that absorbs thermal energy that is dissipated from one or more electric bulbs and optimally converts the dissipated thermal energy into electrical energy using an electric light bulb sleeve.

BACKGROUND

Battery powered portable consumer devices usually require almost daily recharging to operate. In most cases this recharging is done using an electric converter that has a USB interface to a wall socket AC to DC converter, a "wall charger". A wall charger is the most cost-effective and energy-efficient way to recharge a portable electronic device.

But there are instances when a wall socket is unavailable for plugging in a wall charger. For example, a business traveler may check into a hotel room that does not have wall socket. Or the wall outlet in a room are not configured to mechanically mate with a charging device, such as in the case where a foreign country has a different plug configuration. Alternately, plugs may exist, but there are problems running extension cords to where the device needs to be charged.

There are other instances where it is advantageous to power monitoring sensors that are mounted close to a light bulb. For example, a motion detector's best location could be on a lamp fixture, with the constraint that the lamp fixture cannot be modified. One way to do this is to have the motion detector mounted near the light bulb.

In these situations, the ability to charge electronic devices is limited to the energy sources on hand. In most cases a room will have an electric light screwed into an electric socket. These electric lights generate light and dissipate unwanted heat. This heat can be used as an electrical power source to act as a replacement for the wall charger. In this scenario the charging device can supply electrical power and also provide light at the same time.

Therefore, it is desired to have a device that can convert the unneeded heat energy from a standard light bulb to electrical energy and to charge or power an electronic device ideally using a USB interface.

SUMMARY

Described is a thermoelectric generator sleeve that can be attached to the base of a desk or wall lamp and convert the thermal energy to electrical energy.

Also described is a thermoelectric generator sleeve that has one or more thermoelectric generator linings mounted with a thermal heat sink to create a sustained thermal differential for continuous and optimal electrical energy conversion.

Further described is an electronic circuit to regulate and store the electricity created by the thermoelectric generator that then powers low current wireless sensors that are configured within the thermoelectric generator sleeve.

These examples provide to introduce aspects of the invention, but are not meant to limit the scope of the claimed inventions.

BRIEF DESCRIPTION OF THE DRAWINGS

Many aspects of the present invention can be better understood with reference to the following drawings. These components are not drawn scale, rather are complete enough to enable one skilled in the art to understand and construct the claim inventions described as follows.

REFERENCE CHARACTERS

Figure 1:
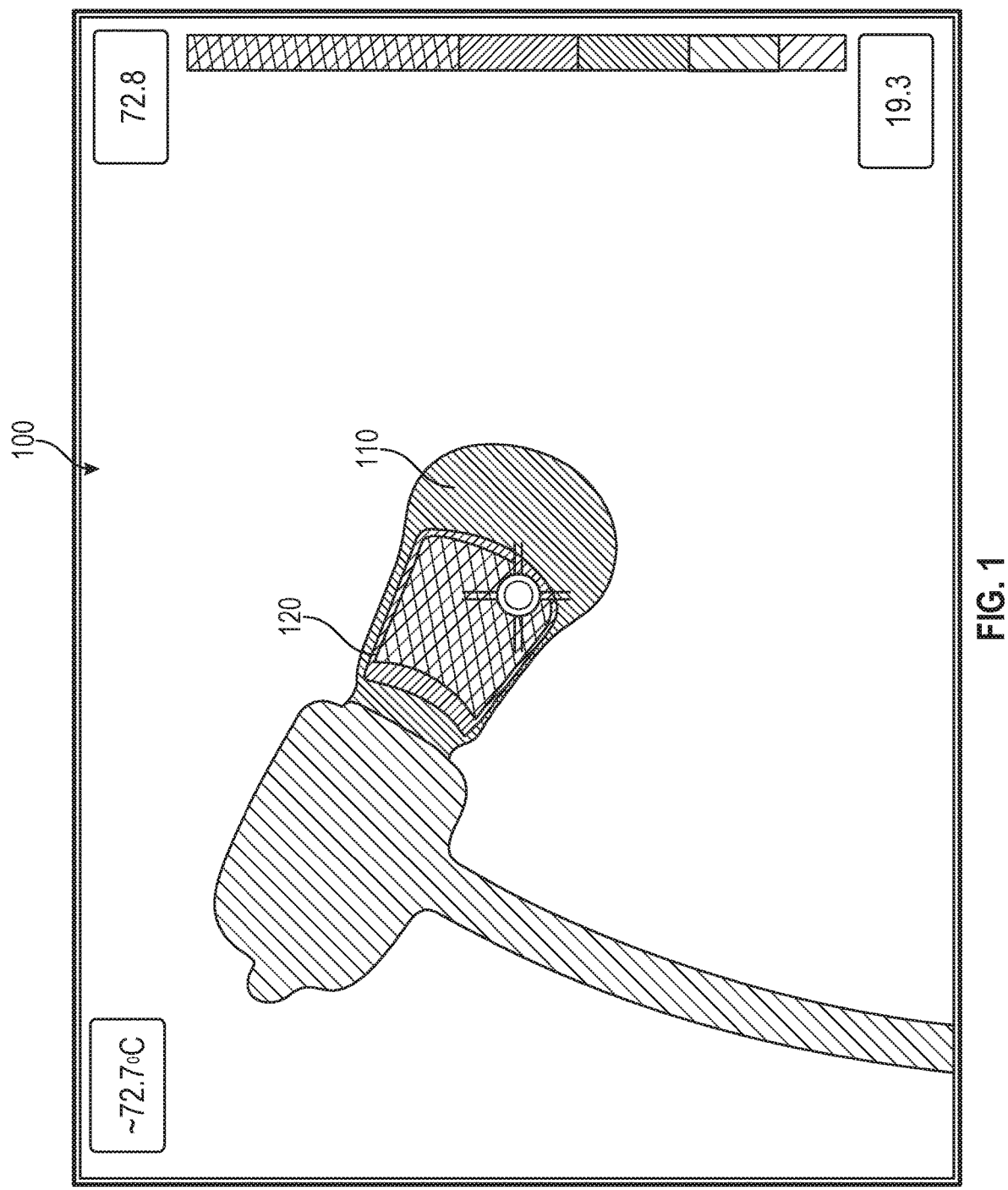
FIG. 1 is a thermal diagram of a light bulb.

A partial list of reference characters is provided to aid the reader in the understanding of the detailed description.

- 110: Light bulb
- 120: Light bulb base
- 210: Light bulb base
- 220: Bulb
- 230: Thermoelectric generator module(s)
- 240: Bulb socket
- 310: Maximum Power Point (MPP)
- 410: Thermoelectric generators sleeve heat sink
- 610: Thermoelectric generator sleeve-1
- 610A: Top portion of sleeve
- 610B: Bottom portion of sleeve
- 611: Body
- 612: Wall
- 613: Leading end
- 614: Trailing end
- 615: Inner surface

616: Outer surface
620: Thermoelectric generator layer
625: Thermal grease layer
630: Thermal sinks layer
640: Fins structure
710: Thermoelectric generator sleeve
720: USB power adapter
1110: Thermoelectric generator sleeve-2
1110A: Top portion
1110B: Bottom portion
1111: Body
1112: Wall
1113: Leading end
1114: Trailing end
1115: Inner surface
1116: Outer surface
1120: Inner thermoelectric generator layer
1122: Middle thermoelectric generator layer
1130: Thermal sink
1140: Fins

DETAILED DESCRIPTION

The various embodiments in this disclosure, as illustrated in the attached figures (FIGS. 1-13) and described in the detailed description that follows may be adapted for use with a base hosting one or more electric bulbs of different sizes and made of different material characteristics, including, but not limited to, the description below.

An incandescent light bulb converts electrical energy into light energy both in the visible and infrared spectrums. Light generated in the visible spectrum is used for illumination, but light generated in the infrared region is dissipated as heat. Infrared heating due to incandescent light bulbs can result in local temperatures that exceed 90 C. Also, infrared heating from light emitting diodes (LED's) range from 19.3 to 72.8 degree C.

A thermoelectric generator outputs a voltage proportional to the thermal gradient across a semiconductor junction. The operational efficiency of the thermoelectric generator is largely dependent on the ability of the thermoelectric generator to have a large thermal gradient. Therefore, a thermoelectric generator that can dissipate excess heat will be best suited at generating the largest amounts of power.

To illustrate how much heat energy is available from a standard consumer LED light bulb, FIG. 1 shows the thermal image 100 of the 10 W LED bulb 110 captured thirty minutes after being in operation. The thermal image 100 of this incandescent bulb demonstrates that: (i) there is temperature gradient across a bulb, (ii) identifying the regions that reach the highest (hottest) temperatures, and (iii) providing an optimal location for thermal energy available for conversion. The measured temperature of the 10 W LED bulb 110 at the LED bulb base 120 at about 72 deg C. Embodiments are directed to increasing the life time usage of LEG bulb 110 by reducing the amount of heat at the LED bulb 110. Studies have found that continued increase in temperature can reduce the lifespan of a LED light bulb. Accordingly, embodiments are directed to increasing the useful life of the LED bulb by utilizing the thermal energy. Incandescent bulbs will have higher thermal outputs.

The amount of output instantaneous power P (measured in Watts) that can be transferred from a thermoelectric generator to a load is calculated using Ohm's law.

$$P(\text{watts})=V(\text{volts})*V(\text{volts})/R(\text{resistance})$$

The amount of energy generated E (Joules) is the average power P (watts) multiplied by time (second).

Figure 2:
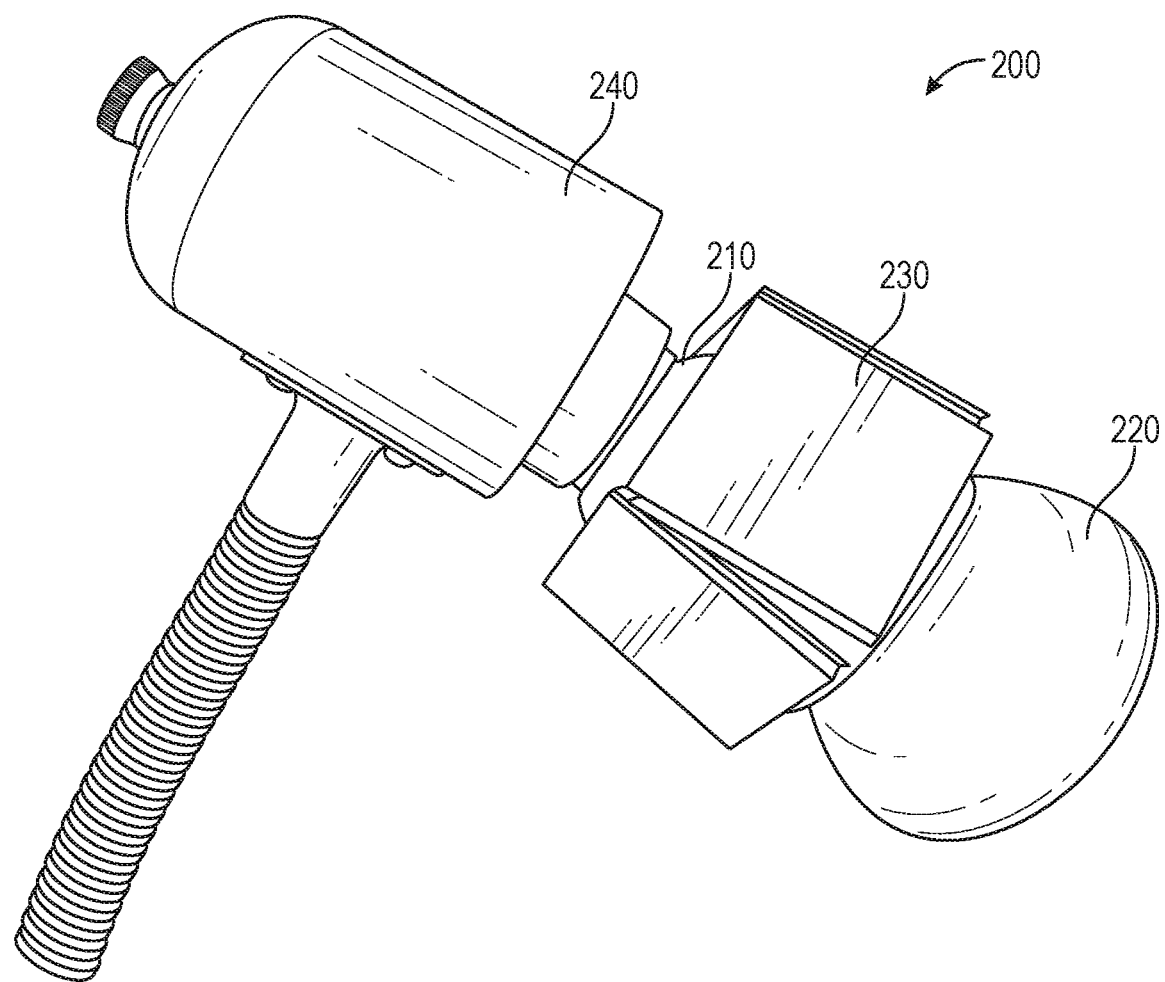
FIG. 2 is a schematic diagram of a multiple thermoelectric generator modules secured around an electric bulb.

FIG. 2 shows a thermoelectric generator 230 secured around the base 210 of an electric bulb 220 that is installed in a bulb socket 240. The thermoelectric generator 230 may be secured to the base 210 in a thermally conductive manner. In some embodiments, thermally conductive paste may be used to secure the thermoelectric generator 230 to the base 210.

Figure 3:
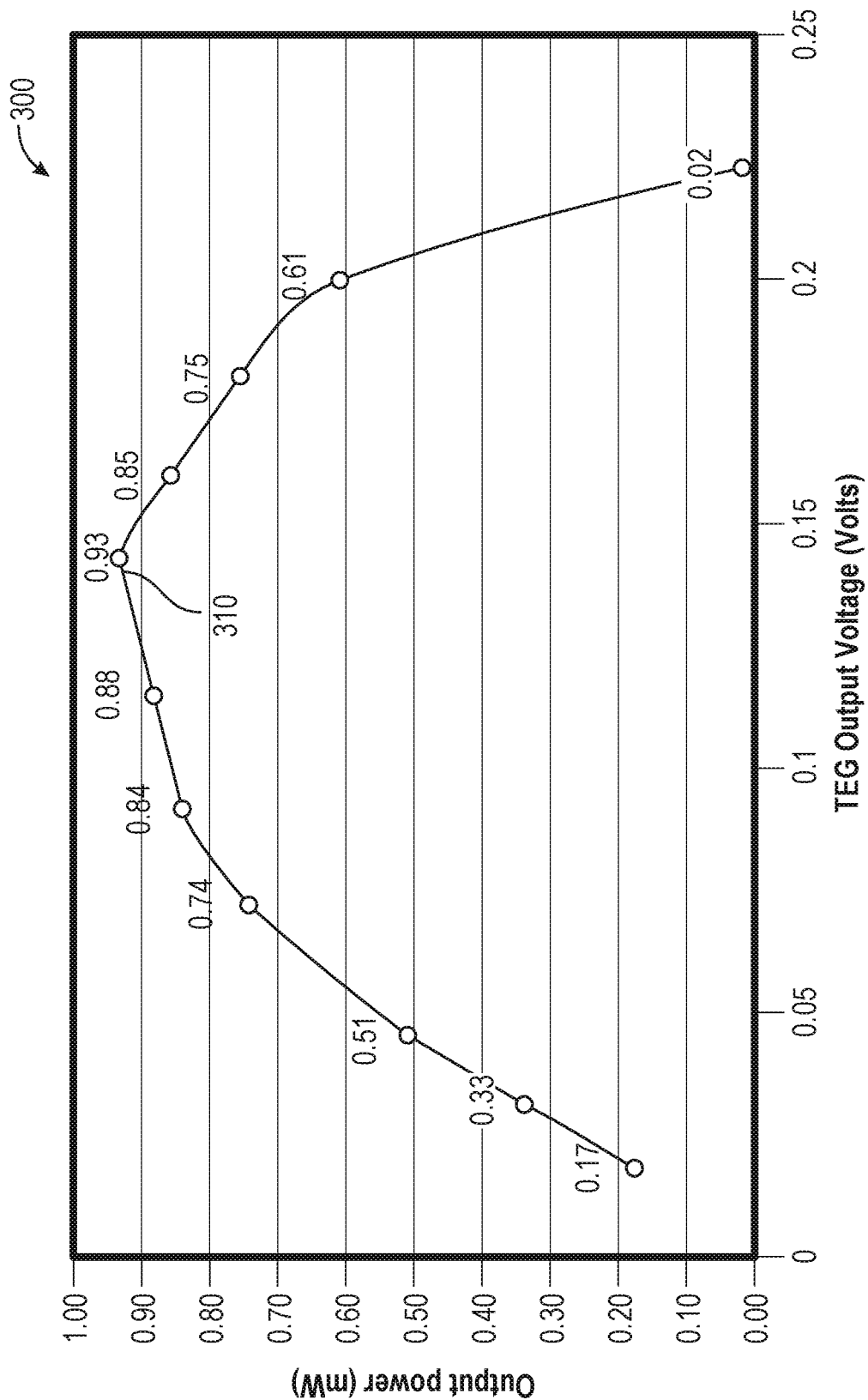
FIG. 3 shows a graph of the amount of electrical power generated by the thermoelectric generator.

FIG. 3 shows the power generated from the thermoelectric generator 230, as plotted against a varying load, results in a plot 300 as shown in FIG. 3. The maximum power point (MPP) 310 occurs when the load resistance is at an optimum value. For example, at the maximum power point, the maximum power from the thermoelectric generators 230 are transferred to the load resistance is set at 22Ω and the thermoelectric generators outputting 0.93 mW of power.

Figure 4:
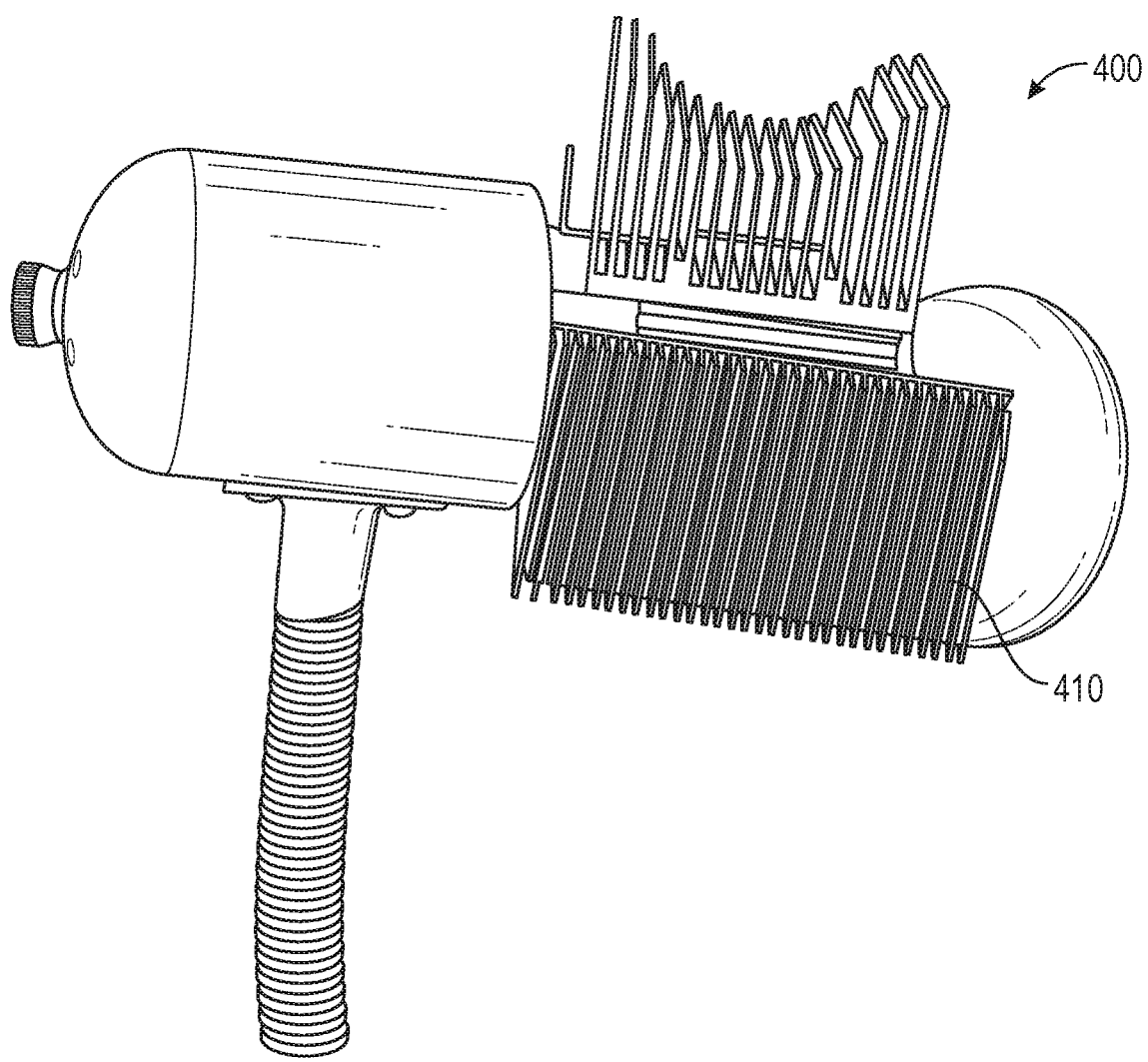
FIG. 4 provides a schematic representation of thermoelectric generators with thermal sinks; the thermoelectric generator configured around a light bulb.
Figure 5:
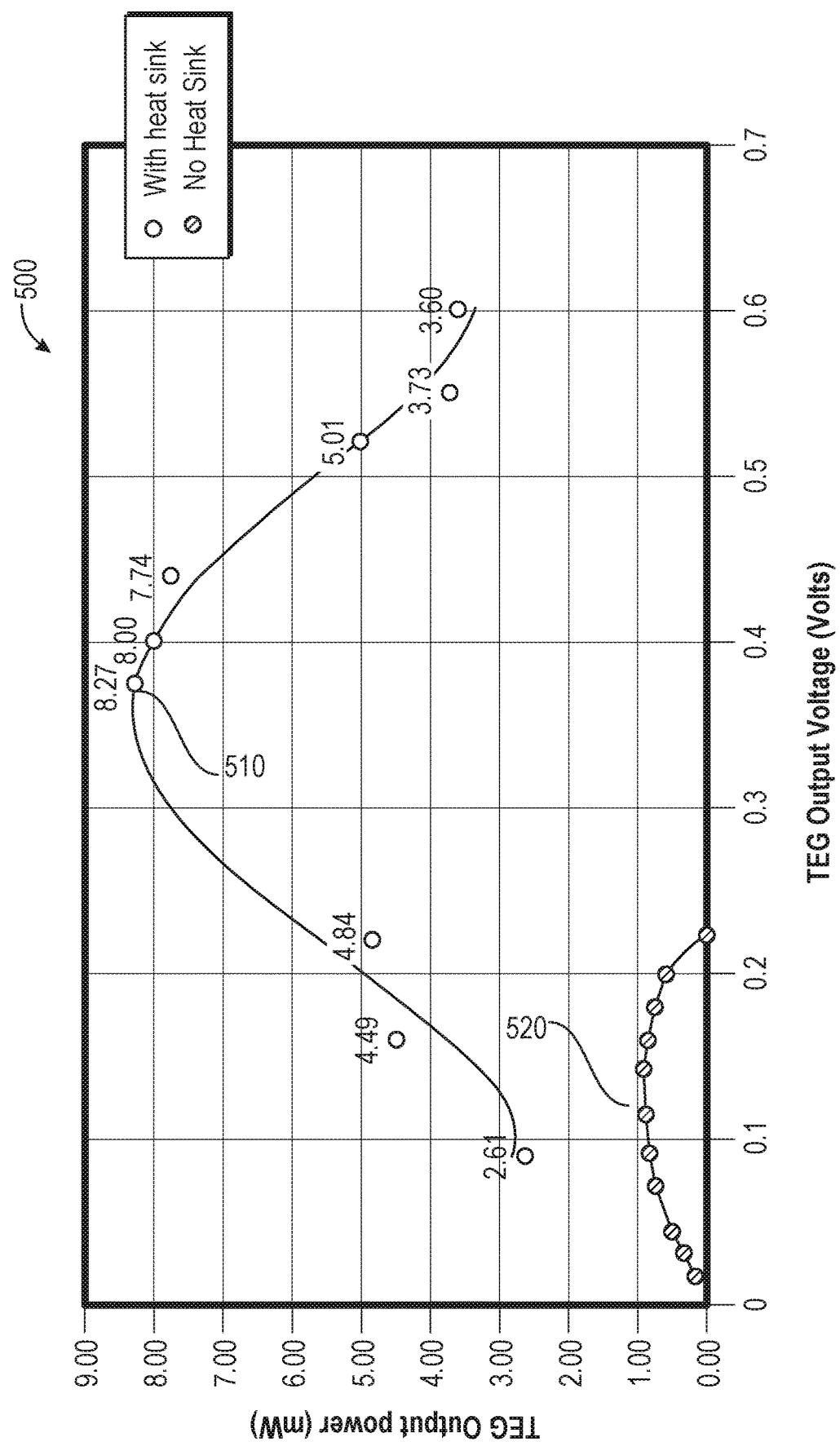
FIG. 5 is voltage and current graph output of a thermoelectric generator having and not having a heat sink.

Now referring to FIG. 4, FIG. 4 illustrates a light bulb 400. In FIG. 4 four aluminum heatsinks 410 are secured to the back of the thermoelectric generators 230. In some embodiments, one or more heatsinks may be secured to the thermoelectric generator 230. A comparison of the results of the maximum power point, where heatsinks are attached is illustrated in plot 500 of FIG. 5. The data shows that a power in the range of 8.25-8.35 mW is output when heatsinks are attached. Data points 510 and 520 denote MPP for with heat sink and without heatsink at the maximum points respectively on the inverted parabola as illustrated in FIG. 5. There is an improvement (approx. 800% or 9 times) in output power with the addition of the heatsink.

A voltage booster circuit (e.g. LTC3108) may be used to raise the voltage level to match the minimum input voltage of the powered electronic device. The thermoelectric generator output wires are electrically connected to the input of the LTC3108 circuit and the output of the voltage booster circuit powers the electronic load or a battery.

Figure 6:
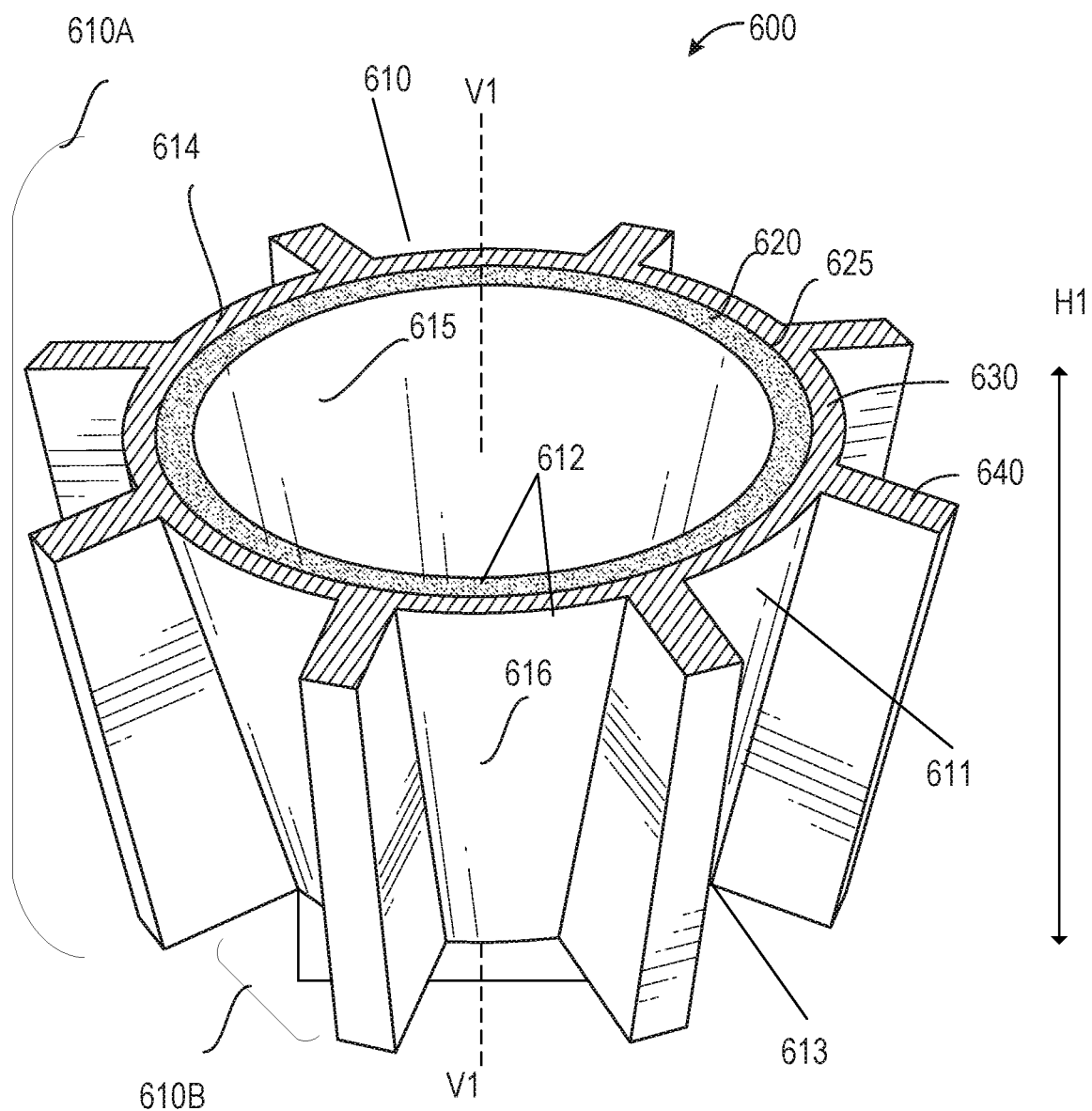
FIG. 6 shows a side view of the thermoelectric generator installed around a light bulb.

FIG. 6 shows a top perspective cross sectional view 600 of a thermoelectric generator sleeve (sleeve or sleeve-1) 610 for a light bulb (Ex 110). The sleeve-1 610 has a frame structure with an overall frusto-conical shape, formed by the combination of a top portion 610A and a bottom portion 610B (not shown in FIG. 6).

The top portion 610A includes a sleeve body (or body) 611 with a hollow open-ended frustoconical wall (or wall) 612 having substantially uniform wall-thickness from end-to-end. Further the body 611 has a leading end 613 and a trailing end 614, a mid-vertical axis V1 through the leading end 613 and the trailing end 614 and a height H1 of the body 611 parallel to the mid-vertical axis V1. The wall 612 surrounding the mid-vertical axis V1 and extending from the leading end 613 to the trailing end 614. In a preferred embodiment, the wall 612 of the sleeve 610 has a maximum diameter at a point nearest to the trailing end 614 and a minimum diameter at a point nearest to the leading end 613. Furthermore, the body 611 consists of an inner surface 615 and an opposite outer surface 616.

The wall 612 consists of an inner thermoelectric generator lining 620 in thermal connection with an outer thermal sink layer 630. For example, the thermoelectric generator lining 620 includes, but not limited to, a semiconductor thermoelectric generator. The thermoelectric generator lining 620 produce a voltage due to a difference in temperature known as a thermal gradient. The larger the difference in temperature across the two sides of a thermoelectric generator lining 620, the larger the amount of power/energy generated.

A thermoelectric generator lining 620 has a layered pair of semiconductors of positively (p-type) and negatively (n-type) doped materials. One example of a thermoelectric generator is a TEC1-12706 flat thermoelectric module manufactured by Hebei I.T. (Shanghai) Co. Ltd. The thermoelectric generator generates electricity using the Seebeck effect.

The thermal sink layer 630 acts as a passive heat exchanger between one side of the thermoelectric generator and a medium with lower temperature. This increases the amount of energy that can be generated due to a larger temperature differential. Examples of thermal sink layer 630 include, but not limited to, aluminum, aluminum alloys or copper-based materials.

A thermal grease material 625 may be sandwiched between the thermoelectric generator lining 620 and the thermal sink layer 630. Examples of the thermal grease material 625, are well known epoxies, silicones, urethanes, and acrylates. These compounds may improve the thermal transfer properties to about 2 W/m-K or more.

The thermal sink layer 630 is equipped with a plurality of fin structure 640 extending from the outer surface 616 (away from the thermoelectric generator lining 620). Alternate fin structures such as pin, straight and flared fin structures may also be used to improve the heat dissipation.

The bottom portion 610B has an attachment secured to the leading end 613 connecting the sleeve 610 to the base with the light bulb. The attachment may be threaded, snap on, bolted, screwed, glued, and/or any mechanical device to affix the sleeve 610 around the light bulb 110, which falls in the scope of this disclosure.

The dimensions of the thermoelectric sleeve 610 may be adapted to closely fit the bulb, allowing for the capture of the greatest thermal energy. In most implementations, the thermoelectric sleeve 610 would have a larger diameter at the top and smaller diameter at the bottom, having a frustoconical shape, that conforms to most light bulbs.

In one implementation, the dimensional details of the body 611 has a height H1 of the body 611 ranges between about 43-45 mm, a diameter at the trailing end 614 ranges between about 79-81 mm, and the diameter near the leading end 613 ranges between about 39-41 mm. The thickness of the thermoelectric generator layer 620 and the thickness of the thermal sink layer 630 each ranging between about 2.5-3.5 mm. Each of the fin structures 640 with a length ranging between about 7-9 mm, breadth ranging between about 2.5-3.5 mm and height ranging between about 43-45 mm.

Figure 7:
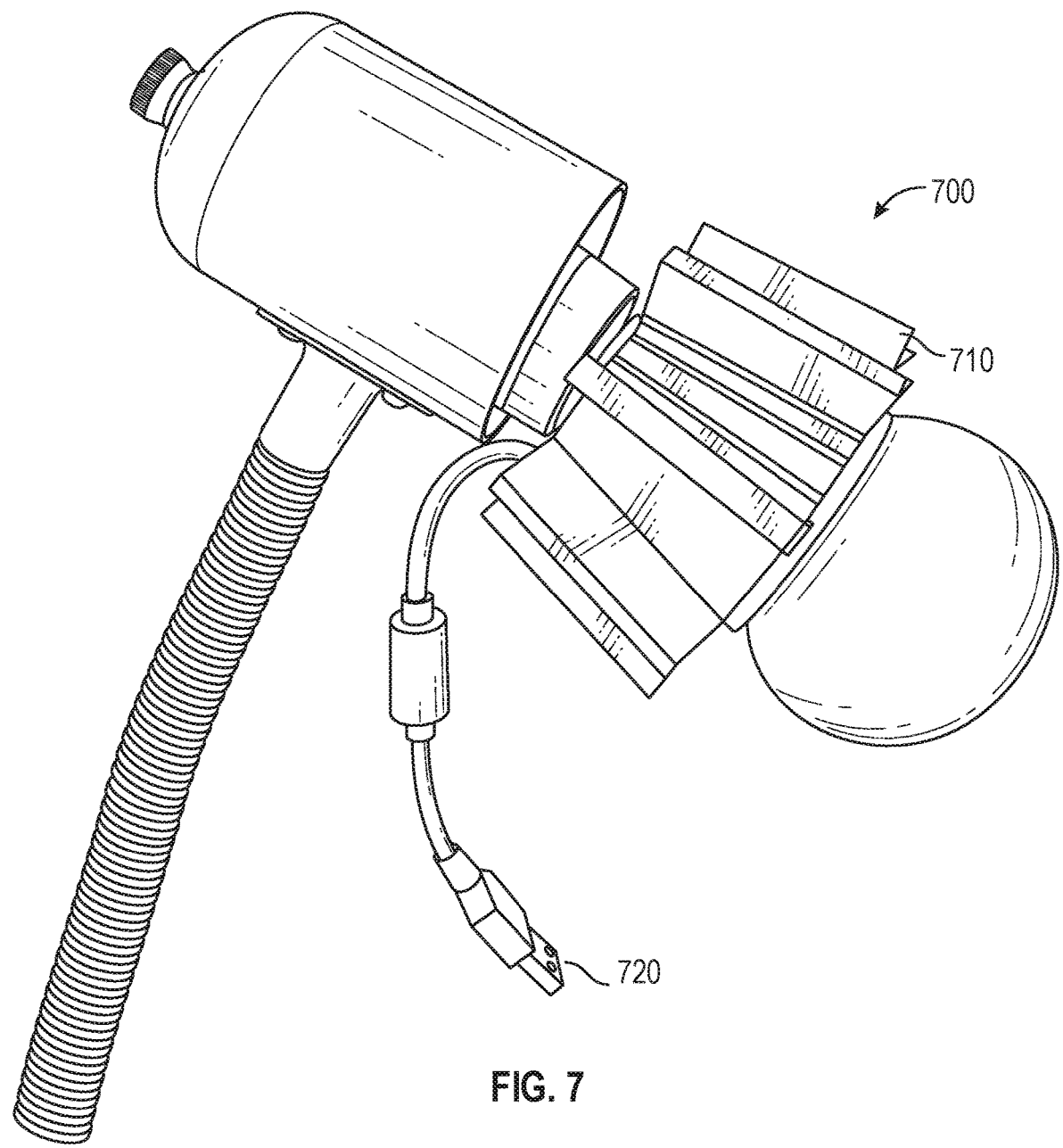
FIG. 7 depicts a diagrammatic representation of a thermoelectric generator sleeve that has a USB output cable.

FIG. 7 depicts a diagrammatic representation 700 of the thermoelectric generator sleeve (sleeve 1A) 710 with a USB output 720 for making way for utilizing the electrical energy derived by converting the thermal energy, for charging small electronic devices.

Figure 8:
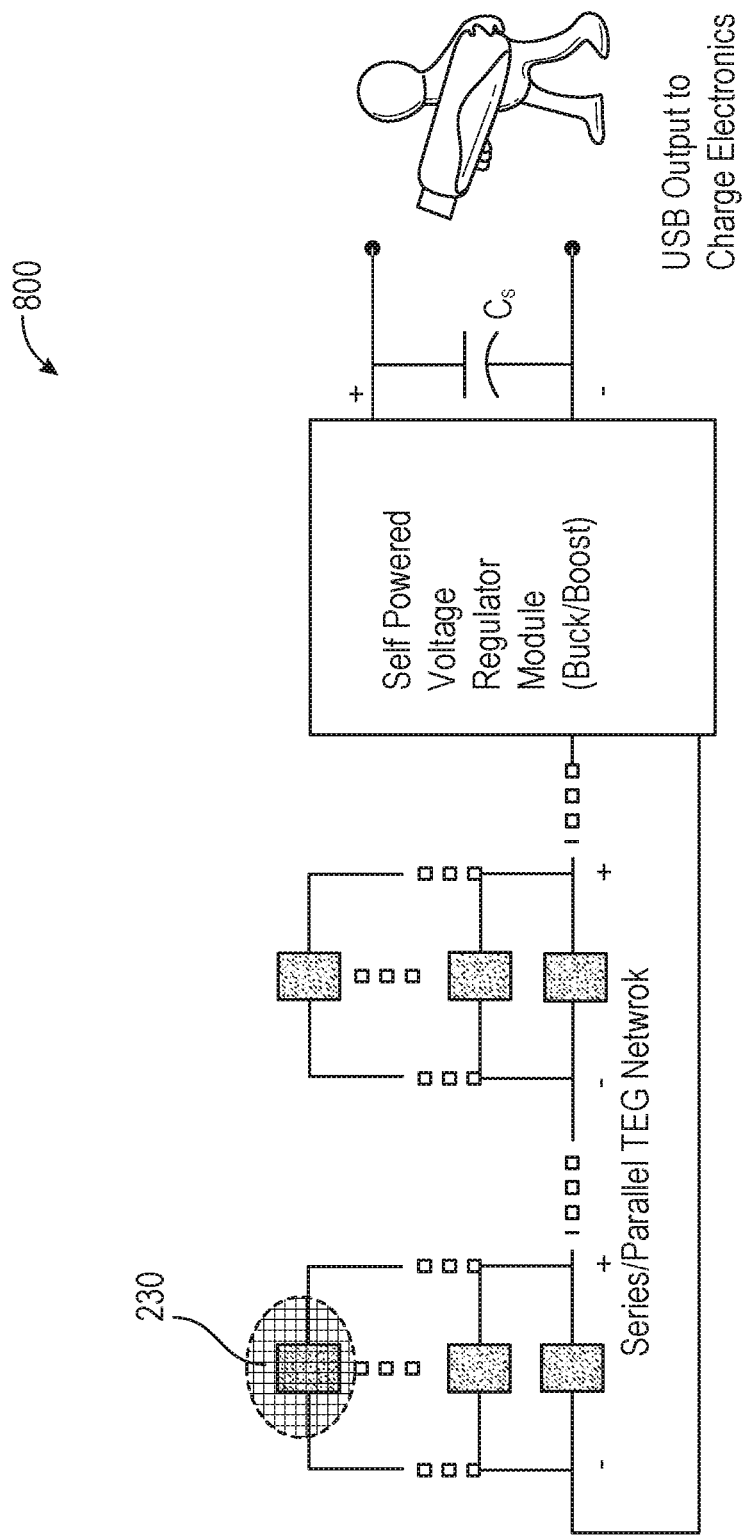
FIG. 8 shows a circuit diagram for power conditioning and utilizing the electrical energy derived from the thermoelectric generator sleeve.

FIG. 8 shows a circuit diagram 800 of the thermoelectric generator to a USB (Universal Serial Bus) outlet. In the event that the load has a minimum voltage requirement, the thermoelectric generators 230 may be wired in series to generate the necessary voltage. Alternately, a voltage converter may be used to boost or raise to a necessary output voltage level (e.g. 5V).

Figure 9:
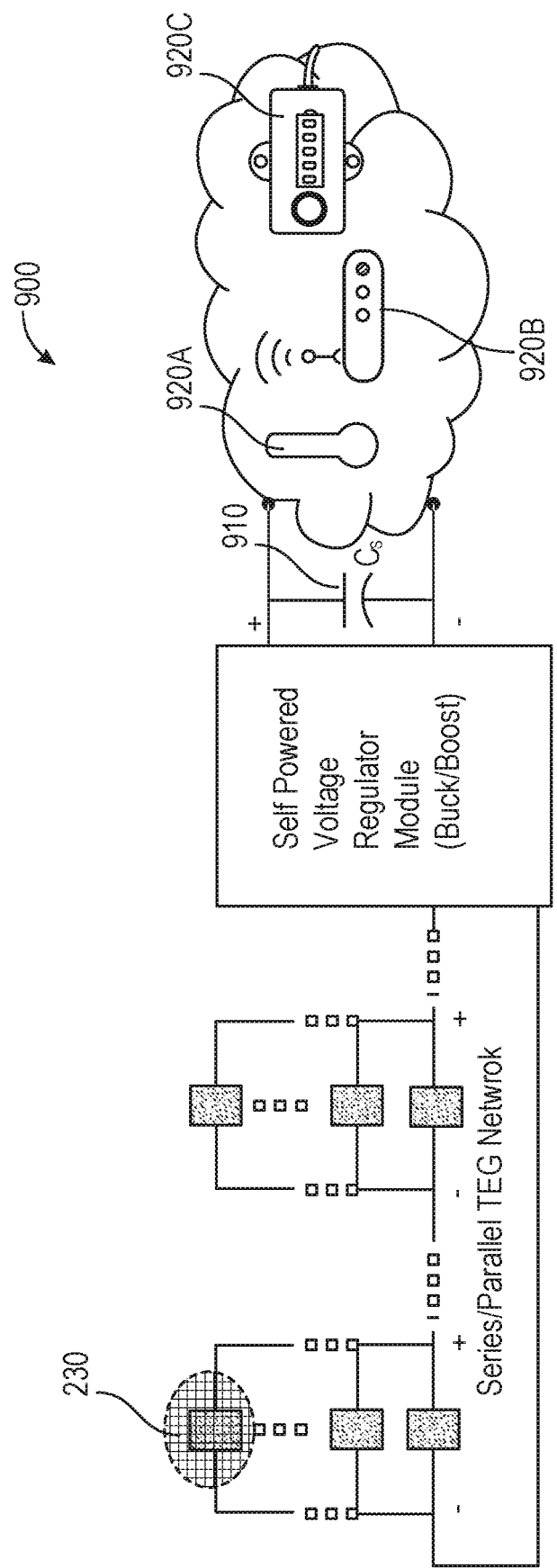
FIG. 9 illustrates a circuit diagram for power conditioning from the thermoelectric generator sleeve to power sensors, wireless communication circuits, and fuel display gauges.

FIG. 9 is a circuit diagram 900 for the thermoelectric generator sleeve including an energy storage capacitor 910, which can temporarily store the energy that was generated and store the generated energy for future use.

The energy storage capacitor may be used in conjunction with low power sensors that may be integrated onto the heatsink sleeve of the thermoelectric generators. For example, energy sensor or thermal sensor 920A can be employed in the circuit for monitoring the amount of energy converted and stored in the thermoelectric generator sleeve 610/1110. Other wireless sensors 920B and display gauge 920C can be powered using the converted energy to provide increased functionality.

The thermoelectric sleeve 610/710 utilizes any temperature differences between the bulb(s) and ambient atmosphere to produce an electric voltage and current. Inside the sleeve, the thermoelectric generators are connected in a series/parallel electrical network (FIGS. 8 and 9) to generate sufficient voltage and current. A self-powered voltage regulator module (VRM), integrated into the sleeve, can be used to buck/boost the converted energy to either trickle charge a battery, or a super capacitor ($C_s$). The VRM output can be brought out as a USB terminal, allowing devices to be plugged in. FIG. 9 shows that sensors and in thermoelectric generator circuits (ICs) can be powered using the re-generated power. Some of these can be thermal sensors and can be used to monitor the bulb temperature and wirelessly communicate information on bulb malfunction and/or safety issues.

Figure 10:
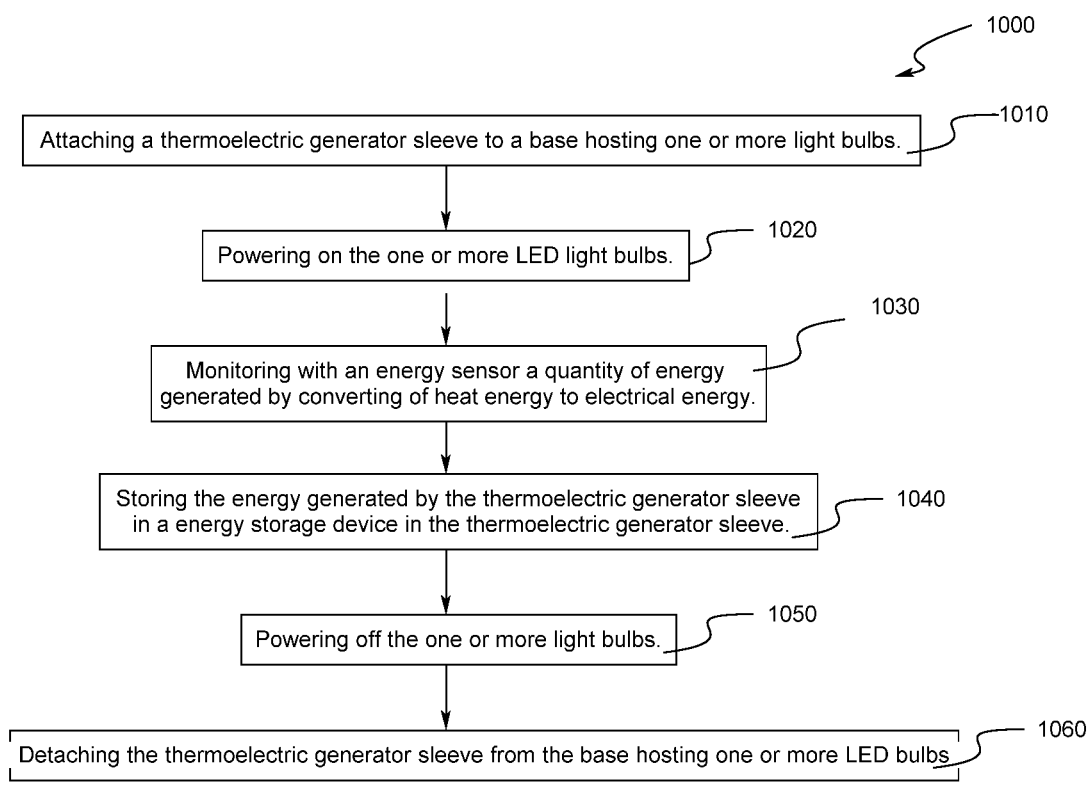
FIG. 10 is a flowchart of a method for the installation and operation of a thermoelectric generator sleeve used near a light bulb.

Referring to FIG. 10, process 1000 describes the method steps for using a re-usable and portable thermoelectric generator sleeve as described in this disclosure. The initial step 1010 includes attaching a thermoelectric generator sleeve to a base that hosts one or more light bulbs. In the next step 1020, powering on the one or more light bulbs. The next step 1030, involves monitoring with an energy sensor a quantity of energy generated by converting the heat energy generated by the one or more light bulbs to electrical energy, the next step 1040 involves, storing the energy generated by the thermoelectric generator sleeve in an energy storage device (e.g. battery or capacitor) in the thermoelectric generator sleeve. The next step 1050, involves powering off the one or more electric light bulbs and the last step 1060 includes detaching the thermoelectric generator sleeve from the base hosting one or more light bulbs. Further the method includes consumption of the energy stored in the thermoelectric generator sleeve to power portable electronic devices.

Figure 11:
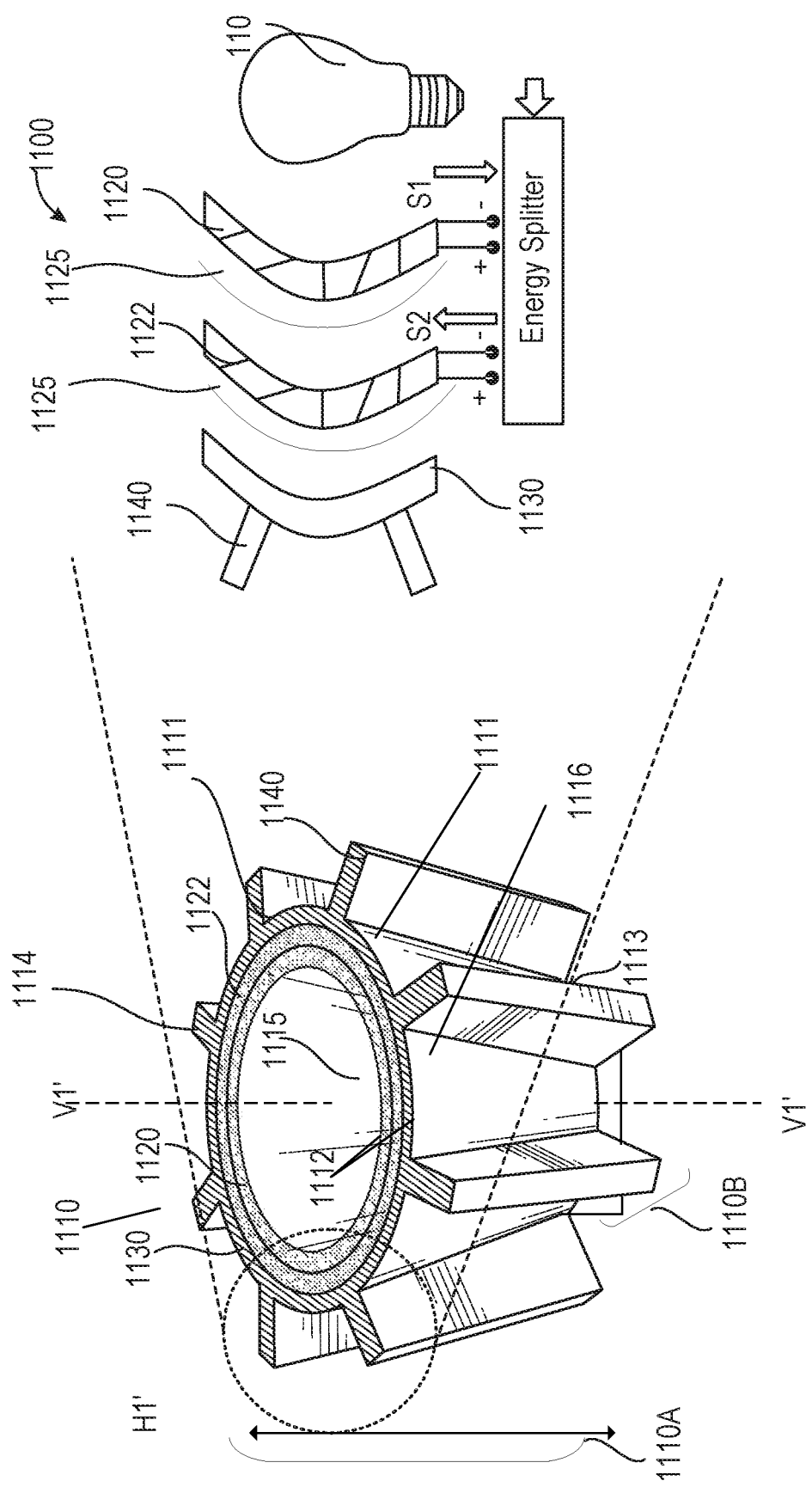
FIG. 11 shows another diagram of thermoelectric generator sleeve.

Referring to FIG. 1 and FIG. 11, in various embodiments, a top perspective cross sectional view 1100 of a thermoelectric generator sleeve (sleeve or sleeve-2) 1110 for a light bulb (Ex 110) including an enlarged view of a portion of sleeve 1110 is as illustrated in FIG. 11. The sleeve 1110 has a frame structure with an overall frusto conical shape, formed by the combination of a top portion 1110A and a bottom portion 1110B.

The top portion 1110A includes a sleeve body (or body) 1111 with a hollow open-ended frusto-conical wall (or wall) 1112 having substantially uniform wall-thickness from end-to-end. Further the body 1111 has a leading end 1113 and a trailing end 1114, a mid-vertical axis V1' through the leading end 1113 and the trailing end 1114 and a height H1' of the body 1111 parallel to the mid-vertical axis V1'. The wall 1112 surrounding the mid-vertical axis V1' and extending from the leading end 1113 to the trailing end 1114. In a preferred embodiment, the wall 1112 of the sleeve 1110 has a maximum diameter at a point nearest to the trailing end 1114 and a minimum diameter at a point nearest to the leading end 1113. Furthermore, the body 1111 consists of an inner surface 615 and an outer surface 616.

The leading end 1113 may include an attachment mechanism (not shown in FIG. 11) to facilitate attachment of the sleeve 1110 to a base hosting a light bulb. The attachment mechanism includes, but not limited to threaded attachment, snap on attachment or any other attachment mechanism, which falls in the scope of this disclosure, for securing the sleeve 1110 around the light bulb 110.

The wall 1112 consists of an inner thermoelectric generator lining 1120 in thermal connection with a middle thermoelectric generator lining 1122 and a thermal sink layer 1130. For example, the thermoelectric generator lining 1120/1122 includes, but not limited to, a semiconductor thermoelectric generator. These thermoelectric generator lining 1120/1122 produce a voltage due to a difference in temperature known as a thermal gradient. The larger the difference in temperature across the two sides of a thermoelectric generator lining 1120/1122, the larger the amount of energy generated. A thermoelectric module used in the thermoelectric generator lining 1120/1122 requires a pair of dissimilar pieces of metal, or positively (p-type) and negatively (n-type) doped semiconductors. An example includes, a TEC1-12706 flat thermoelectric generator module. The semiconductor pellets inside the thermoelectric generator module are serially linked together like a chain in order to extract the largest amount of power.

The thermal sink layer 1130 acts as a passive heat exchanger that transfers the heat generated by the heat source (Ex Light bulb 110) to a fluid medium, often air, where it is dissipated away from the sleeve 610, thereby increasing the overall efficiency of the sleeve 1110. Example of thermal sink layer 1130 include, but not limited to, aluminum, aluminum alloys or copper-based materials.

A thermal grease material 1125 may be used as a sandwich layer to create a thermal connection between the thermoelectric generator lining 1120/1122 and the thermal sink layer 1130 to enhance heat transfer between the two surfaces by filling in any microscopic voids caused by surface roughness. Examples of the thermal grease material 1125, also known as thermal joint compound, includes but not limited to, silicone grease loaded with zinc oxide, non-silicone-based compounds or graphite sheets.

The thermal sink layer 1130 is equipped with plurality of fins structures 1140 radiating externally from the outer surface (away from the thermoelectric generator lining 1120/1122). Other type of fin structures including, but not limited to, pin, straight and flared fin structures may be used to increase the efficiency of the thermal sink layer 1130.

The bottom portion 1110B includes an attachment mechanism (not shown in FIG. 11) secured to the leading end 1113 to facilitate attachment of the sleeve 1110 to a base having a light bulb. The attachment mechanism includes, but not limited to threaded attachment, snap on attachment or any other attachment mechanism, which falls in the scope of this disclosure, for securing the sleeve 1110 around the light bulb 110.

In an exemplary embodiment, the dimensions of the thermoelectric generator sleeve 1110 is made adaptable to fit to a single electric bulb to custom fit the bulb base accurately. The cylindrical structure would have a larger diameter at the top and smaller diameter at the bottom, basically giving a frustoconical shape. The base having an opening large enough to accommodate the bulb and fit the lamp base perfectly.

For example, the dimensional details of the body 1111 are described in greater details below. A height of the body 1111 ranges between about 43-45 mm, a diameter at the trailing end 1114 ranges between about 85-87 mm, and the diameter near the leading end 1113 ranges between about 45-47 mm. The thickness of the thermoelectric generator layer 1120/1122 and the thickness of the thermal sink layer 1130 ranging between about 2.5-3.5 mm. Each of the fin structures 1140 with a length ranging between about 7-9 mm, breadth ranging between 2.5-3.5 about mm and height ranging between about 43-45 mm.

The thermoelectric generator layers 1120/1122 of sleeve 1110 have the ability to create (re-cycle) energy on a temperature difference (using Seebeck effect) or consume energy and cool one side of the thermoelectric generator (and heat the other, using for example the Peltier effect). A portion of the recycled energy from the inner thermoelectric generator lining 1120 (or energy directly from the bulb outlet power) is fed to the middle thermoelectric generator lining 1122 to further cool the inner thermoelectric generator lining 1120 and increase its energy-converting efficiency. The inner thermoelectric generator lining 1120, which represents the inner lining for energy recycling is configured to work in a Seebeck mode and the adjacent middle thermoelectric generator lining 1122, which represents the outer lining for inner thermoelectric generator lining 1120 is configured to work in the Peltier Mode. This double thermoelectric generator module sandwich structure allows for compact cooling of the hottest part of a lamp bulb 110 and eliminates the need for an impeller or fan and moving parts. The portion of recycled energy (in series and parallel) is recycled/fed-back to improve and provide an impeller-less setup This can also help/prevent the bulb from overheating and any related fire-hazards by using to cool the inner thermoelectric generator lining 1120.

Figure 12:
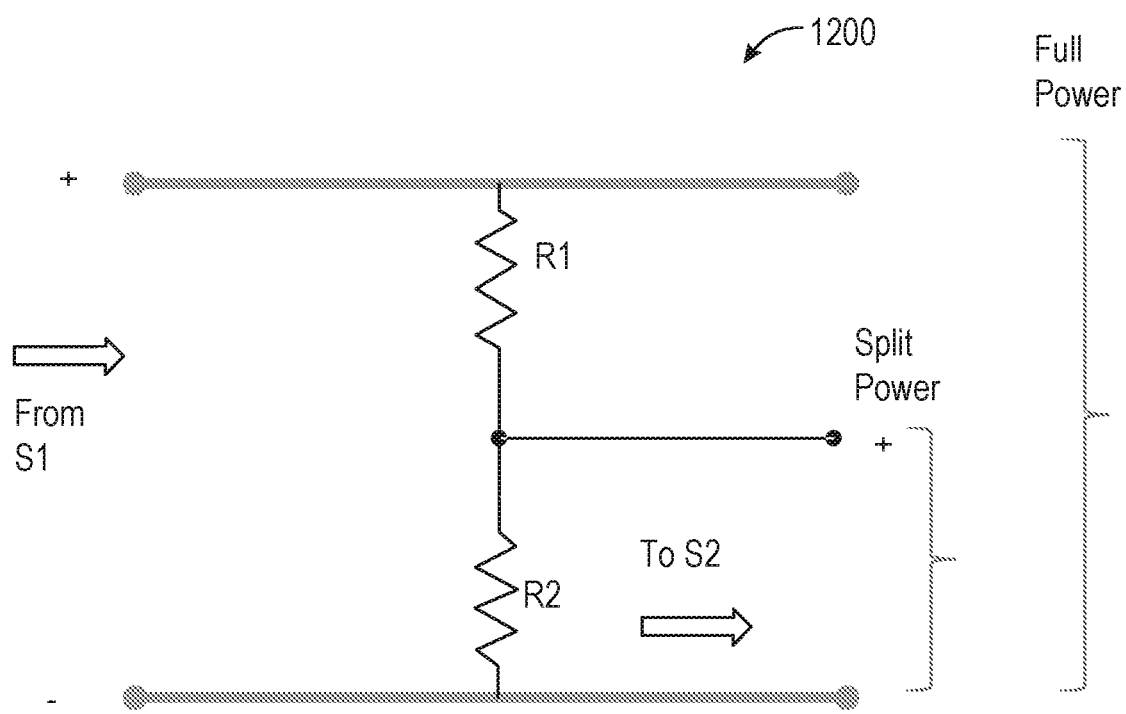
FIG. 12 is a circuit diagram for splitting the power from the thermoelectric generator sleeve using passive electrical components.

Referring to FIG. 11 and FIG. 12, the thermoelectric generator 1120/1122 can either be powered by inner thermoelectric generator lining 1120 or directly from the bulb 110 outlet. A diagram 1200 of a power splitter is as shown in FIG. 12. A resistor divider is used to split the power components resulting in energy sharing using the below formula. Power output to $S2=[(R2)/(R1+R2)]$ *Power from S1. Resistors R1 and R2 can be adjusted based on amount of desired energy split. Direction of the current for S2 is chosen to cool the bulb side of the thermoelectric generator module (Ex 1120) and transfer the heat to the outermost side of the concentric thermoelectric generator assembly (Ex 1122).

The embodiments described towards the sleeve 610/1110 represents an aesthetically designed thermoelectric generator-based sleeve having an overall frustoconical shaped wall with concentric thermoelectric generator lining in thermal connection with thermal heat sinks equipped with plurality of heat sinks. Each of the thermoelectric lining has tiny semi-conductor (N and P doped) pellets that are serially connected to cumulatively convert heat differential at the bulb base and generate electricity—capable of powering low-power electronics and sensors. Thus, the sleeve 610/1110 represent a holistic and universal design of a thermoelectric generator sleeve for most-commonly known light bulbs around us.

Figure 13:
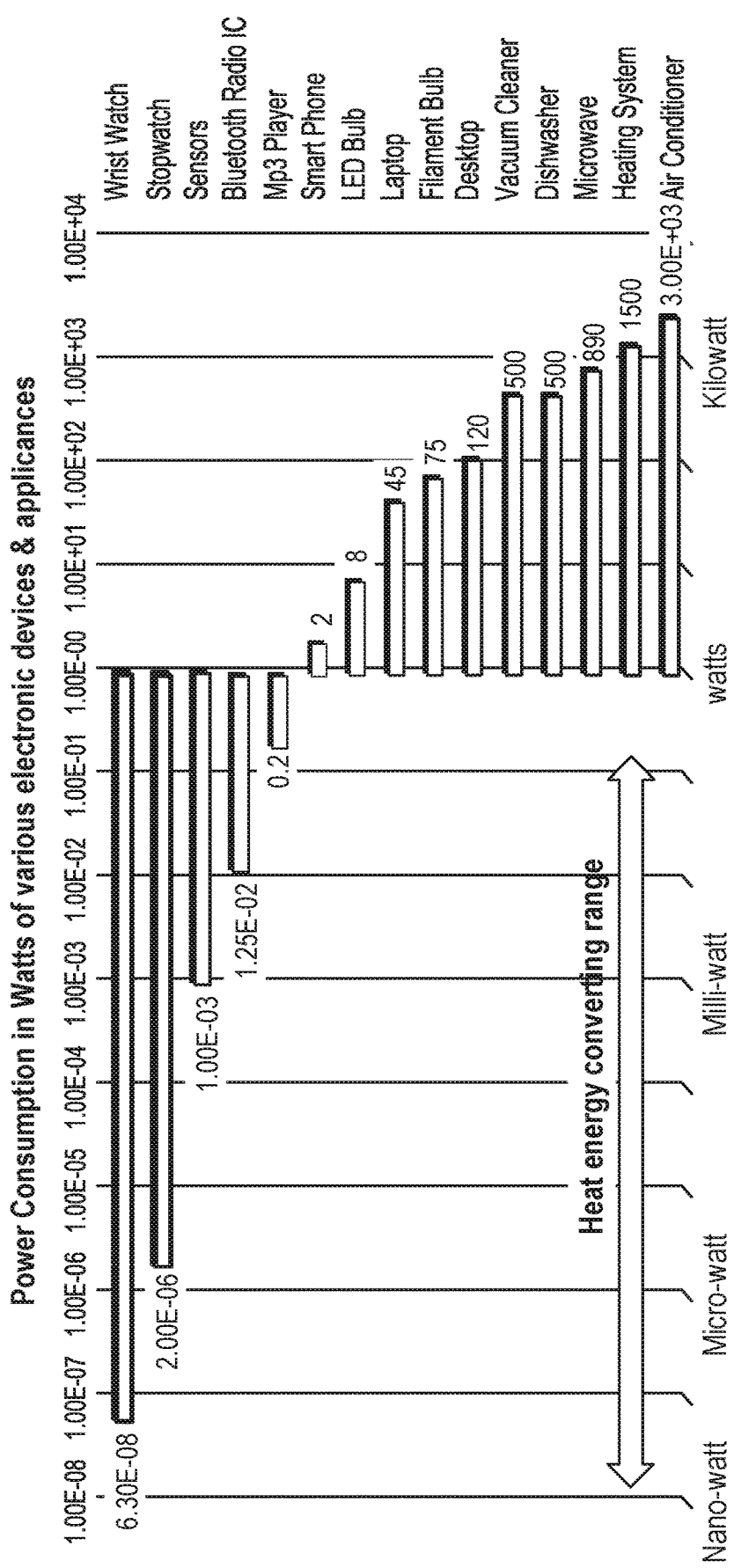
FIG. 13 shows a plot of energy consumption for range of household devices as compared to the typical power output of the thermoelectric generator sleeve.

An average household has about forty light bulbs. Assuming ten of them are powered on at any time, about 80 mW of energy can be recycled. If thermoelectric generators are place directly into the base of the light bulbs, the energy converted from multiple bulbs could be stored in a super capacitor (or battery) for powering various devices. Several household electronic devices can possibly be powered with milli-watts of recycled energy. The table in FIG. 13 summarizes the ranges of power consumed by various household electronics and appliances and the range of devices that could be powered by the thermoelectric generator recycled energy according to the above described embodiments.

In a preferred embodiment, a thermoelectric generator sleeve for converting a heat energy from one or more electric light bulbs to electrical energy, includes a frame structure, having a top portion and a bottom portion, the top portion including, a body having a leading end, a trailing end, a mid-vertical axis through the leading end and the trailing end, a height parallel to the mid-vertical axis, and a frustoconical sidewall surrounding the mid-vertical axis and extending from the leading end to said trailing end, the body having an inner surface and an opposite outer surface, the frustoconical sidewall having at least two layers, a first layer and a second layer therethrough, the layers being in thermal communication with each other; wherein the first layer comprises of a thermoelectric generator lining and the second layer comprises of a thermal sink layer equipped with plurality of fin structures; and the bottom portion equipped with an attachment mechanism to facilitate an attachment of said thermoelectric generator sleeve to a base hosting said one or more electric light bulbs.

Further the thermoelectric generator lining includes one or more thermoelectric generator modules arranged in a series—parallel manner to convert a heat energy to electrical energy and the thermal sink layer is made of thermally conducting material. The thermoelectric generator including a voltage booster electronic circuit powered by an electrical energy generated by the thermoelectric generator modules. The thermoelectric generator including a Universal serial Bus (USB) output port for charging electronic devices. The thermoelectric generator sleeve including a safety sensor powered by a converted energy to detect bulb malfunction, a wireless communication component to transmit key sensor data to a local base station, a display gauge for displaying a converted power energy and one or more energy storage devices. The thermoelectric generator sleeve, wherein said one or more electric light bulbs includes an incandescent bulb, Light Emitting Diode (LED) Light bulbs, fluorescent bulbs and/or halogen bulbs In another preferred embodiment a system for converting heat energy form one or more electric light bulbs includes a base hosting one or more electric light bulbs, a thermoelectric generator sleeve and the thermoelectric generator sleeve attachable along a circumference of a base holding said one or more of the electric light bulb, said thermoelectric generator sleeve having an inner surface facing said one or more electric light bulbs and an outer surface facing away from said one or more electric light bulbs, one or more thermo electric generators arranged on said inner surface and said outer surface lined with heat sinks with fin structures to back said one or more thermo electric generators. Further, thermoelectric generators along said inner surface are arranged on a flexible material to make close contact with a bulb and maximize heat absorption and thermo electric generator modules are arranged in series or parallel or a combination thereof. Wherein said thermoelectric generator sleeve is made of thermally conducting material, including a voltage booster powered by an electrical energy generated by the thermo electric generators and a USB output port for charging electronic devices.

In yet another preferred embodiment, a method for converting a heat energy from one or more electric light bulbs to an electrical energy, including attaching a thermoelectric generator sleeve to a base hosting one or more electric light bulbs, powering on said one or more electric light bulbs, monitoring with an energy sensor a quantity of an energy generated by converting said heat energy to said electrical energy, storing said electrical energy generated by said thermoelectric generator sleeve in an energy storage device in said thermoelectric generator sleeve, powering off said one or more electric light bulbs, detaching said thermoelectric generator sleeve from said base hosting one or more electric light bulbs and utilizing the energy stored in the thermoelectric generator sleeve to power electronic devices.

The many aspects and benefits of the invention are apparent from the detailed description, and thus, it is intended for the following claims to cover all such aspects and benefits of the invention which fall within the scope and spirit of the invention. In addition, because numerous modifications and variations will be obvious and readily occur to those skilled in the art, the claims should not be construed to limit the invention to the exact construction and operation illustrated and described herein. Accordingly, all suitable modifications and equivalents should be understood to fall within the scope of the invention as claimed herein.

I claim:

1. A heat energy harvesting sleeve for harvesting a heat energy from one or more electric light bulbs comprising:
   a frame structure, said frame structure having a top portion and a bottom portion; said top portion comprising:
      a body having a leading end, a trailing end, a mid-vertical axis through said leading end and trailing end, a height parallel to the mid-vertical axis, and a frustoconical sidewall surrounding the mid-vertical axis and extending from said leading end to said trailing end, said body having an inner surface and an opposite outer surface, said frustoconical sidewall having at least two layers having substantially uniform thickness from said leading end to said trailing end, a first layer and a second layer therethrough, said layers being in thermal communication with each other;
   wherein said first layer comprises of a thermoelectric generator lining and said second layer comprises of a thermal sink layer equipped with plurality of fin structures; and
      said bottom portion equipped with an attachment mechanism to facilitate an attachment of the heat energy harvesting sleeve to a base hosting the one or more electric light bulbs.

2. The heat energy harvesting sleeve as described in claim 1, wherein the thermoelectric generator lining comprises of one or more thermoelectric generator modules arranged in a series—parallel manner to harvest a heat energy.

3. The heat energy harvesting sleeve as described in claim 2, further comprising a voltage booster electronic circuit powered by an electrical energy generated by the one or more thermoelectric generator modules.

4. The heat energy harvesting sleeve as described in claim 1, wherein the thermal sink layer is made of thermally conducting material.

5. The heat energy harvesting sleeve as described m claim 1, further comprising a universal serial bus (USB) output port for charging electronic devices.

6. The heat energy harvesting sleeve as described in claim 1, further comprising a safety sensor powered by a harvested energy to detect bulb malfunction.

7. The heat energy harvesting sleeve as described in claim 1, further comprising a wireless communication component to transmit key sensor data to a local base station.

8. The heat energy harvesting sleeve as described in claim 1, further comprising a display gauge for displaying a harvested power energy.

9. The heat energy harvesting sleeve as described m claim 1, further comprising energy storage devices.

10. The heat energy harvesting sleeve as described in claim 1, wherein the one or more electric light bulbs includes an incandescent bulb.

11. The heat energy harvesting sleeve as described in claim 1, wherein the one or more electric light bulbs includes Light Emitting Diode (LED) Light bulbs.

12. The heat energy harvesting sleeve as described in claim 1, wherein the one or more electric light bulbs includes fluorescent bulbs.

13. The heat energy harvesting sleeve as described in claim 1, wherein a thickness of the first layer is between about 2.5-3.5 millimeters (mm); and
wherein a thickness of the second layer is between about 2.5-3.5 mm.

14. The heat energy harvesting sleeve as described in claim 1, wherein the body comprises a flexible material that is configured to make close contact with the one or more electric light bulbs.

15. The heat energy harvesting sleeve as described in claim 1, wherein the leading end is configured to operate in a Seebeck mode and the trailing end is configured to operate in a Peltier mode.

16. The heat energy harvesting sleeve as described in claim 1, wherein energy that is harvested from the heat energy harvesting sleeve is split to provide power for two or more outputs.

\* \* \* \* \*